United States Patent
Foote, Jr. et al.

(10) Patent No.: US 7,230,517 B1
(45) Date of Patent: Jun. 12, 2007

(54) SYSTEM AND METHOD FOR USING PLASMA TO ADJUST THE RESISTANCE OF THIN FILM RESISTORS

(75) Inventors: Richard Wendell Foote, Jr., Kennedale, TX (US); Tom Bold, Roanoke, TX (US); Rodney Hill, Mansfield, TX (US); Abhay Ramrao Deshmukh, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 200 days.

(21) Appl. No.: 10/927,357

(22) Filed: Aug. 26, 2004

(51) Int. Cl.
*H01C 7/02* (2006.01)

(52) U.S. Cl. .......................... 338/25; 338/29; 338/333

(58) Field of Classification Search .................. 338/25, 338/28–29, 333–334; 216/67, 68; 427/255.4, 427/569; 156/345.43; 438/689, 706, 710
See application file for complete search history.

(56) References Cited

U.S. PATENT DOCUMENTS

| | | | |
|---|---|---|---|
| 6,809,034 B2 * | 10/2004 | Ito et al. | 438/706 |
| 2004/0075527 A1 * | 4/2004 | Zitzmann et al. | 338/28 |
| 2004/0129673 A1 * | 7/2004 | Belyansky et al. | 216/67 |
| 2004/0203241 A1 * | 10/2004 | Hampden-Smith et al. | 438/689 |
| 2005/0003673 A1 * | 1/2005 | Mahdavi | 438/710 |

* cited by examiner

*Primary Examiner*—Tu Hoang

(57) ABSTRACT

A system and method is disclosed for using plasma to adjust the resistance of a thin film resistor. In one advantageous embodiment of the invention, the resistance of a thin film resistor is increased to cause the thin film resistor to have a desired higher value of resistance. The thin film resistor is formed having an initial value of resistance that is less than the desired value of resistance. Then the thin film resistor is placed in an oxidizing atmosphere. A surface of the thin film resistor is then oxidized to increase the initial value of resistance to the desired value of resistance. The amount of the increase in resistance may be selected by selecting the temperature of the oxidizing atmosphere.

21 Claims, 3 Drawing Sheets

SYSTEM AND METHOD FOR USING PLASMA TO ADJUST THE RESISTANCE OF THIN FILM RESISTORS

TECHNICAL FIELD OF THE INVENTION

The invention relates generally to the manufacturing of semiconductor integrated circuits and, more particularly, to the use of plasma to adjust the resistance of thin film resistors.

BACKGROUND OF THE INVENTION

In the manufacture of semiconductor circuits resistor elements are commonly created using thin film resistors ("TFR"). Thin film resistors are usually made of a metal that is combined with another material to mitigate the resistance of the metal and make the thin film resistor material have a high resistance. One typical example of a thin film resistor material is silicon carbide chrome ("SiCCr"). Another typical example is tantalum nitride ("TaN").

Because a high resistance per unit area is generally desired for a thin film resistor, the thickness of a thin film resistor is usually very thin. For example, a thin film resistor may have a thickness from seventy five Ångstroms (75 Å) to one hundred Ångstroms (100 Å). This thickness range may also be expressed as a range from seven and one half nanometers (7.5 mm) to ten nanometers (10.0 nm).

The requirement that a thin film resistor be very thin presents manufacturing problems. During the manufacturing process it may be very difficult to accurately control the thickness of a thin film resistor. The deposition rate of a thin film resistor is relatively high. Any slight variation in the deposition rate will change the thickness of the thin film resistor and affect the value of the resistance of the thin film resistor. Variation in the resistance of the thin film resistors in a semiconductor circuit causes inferior integrated circuit device performance, leading to low yields, increased scrap, and lost market opportunities.

Therefore, it would be desirable to have a method to adjust the value of resistance of a thin film resistor after the thin film resistor has been manufactured. One prior art method for adjusting the value of resistance of a thin film resistor employs thermal cycles. However, the use of thermal cycles is not always practical. One problem is that a thermal cycle is not self limiting. It is possible that the thermal cycle method may introduce more variation in the resistance of a thin film resistor than it eliminates.

Therefore, there is a need in the art for an efficient system and method for adjusting a value of resistance of a thin film resistor after the thin film resistor has been deposited in a semiconductor manufacturing process.

SUMMARY OF THE INVENTION

In order to address the deficiencies of the prior art, it is a primary object of the present invention to provide a system and method for adjusting a value of resistance of a thin film resistor.

In one advantageous embodiment of the present invention, an initial resistance of a thin film resistor is increased to cause the thin film resistor to have a desired higher value of resistance. A thin film resistor is formed having an initial value of resistance that is less than a desired value of resistance. Then the thin film resistor is placed in an oxidizing atmosphere. A surface of the thin film resistor is then oxidized to increase the initial value of resistance to the desired value of resistance.

As the surface of the thin film resistor is oxidized, the oxide layer slows the arrival of new oxidants to the remaining unoxidized thin film resistor material. As the thickness of oxide increases, the oxidation rate slows because of the longer time needed for the oxidizing specie to diffuse through the oxide layer.

The system and method of the invention provides more precise control in the manufacture of thin film resistors. For example, a thin film resistor may be deposited with a relatively thick layer. The deposition equipment may be quite capable of precisely controlling the deposition of the thin film resistor for the relatively thick layer. After the thin film resistor has been deposited, the resistance of the thin film resistor will be too low. However, the resistance of the thin film resistor may be increased to its desired value using the oxidation method of the present invention.

The amount of the increase in resistance for a thin film resistor may be selected by selecting the temperature of the oxidizing atmosphere. This is because the diffusion rate of the oxidation process is dependent on the temperature at which the oxidation process is carried out.

It is an object of the present invention to provide a system and method for adjusting a value of resistance of a thin film resistor.

It is also an object of the present invention to provide a system and method for oxidizing a surface of a thin film resistor to increase a value of resistance of the thin film resistor.

It is yet another object of the present invention to provide a system and method for oxidizing a surface of a thin film resistor by placing the thin film resistor in a downstream plasma reactor unit.

It is still another object of the present invention to provide a system and method for oxidizing a surface of a thin film resistor by using a diffusion limited oxidation process.

Before undertaking the DETAILED DESCRIPTION OF THE INVENTION below, it may be advantageous to set forth definitions of certain words and phrases used throughout this patent document. The terms "include" and "comprise," as well as derivatives thereof, mean inclusion without limitation. Definitions for certain words and phrases are provided throughout this patent document, and those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged thin film resistor manufacturing system.

Figure 1:
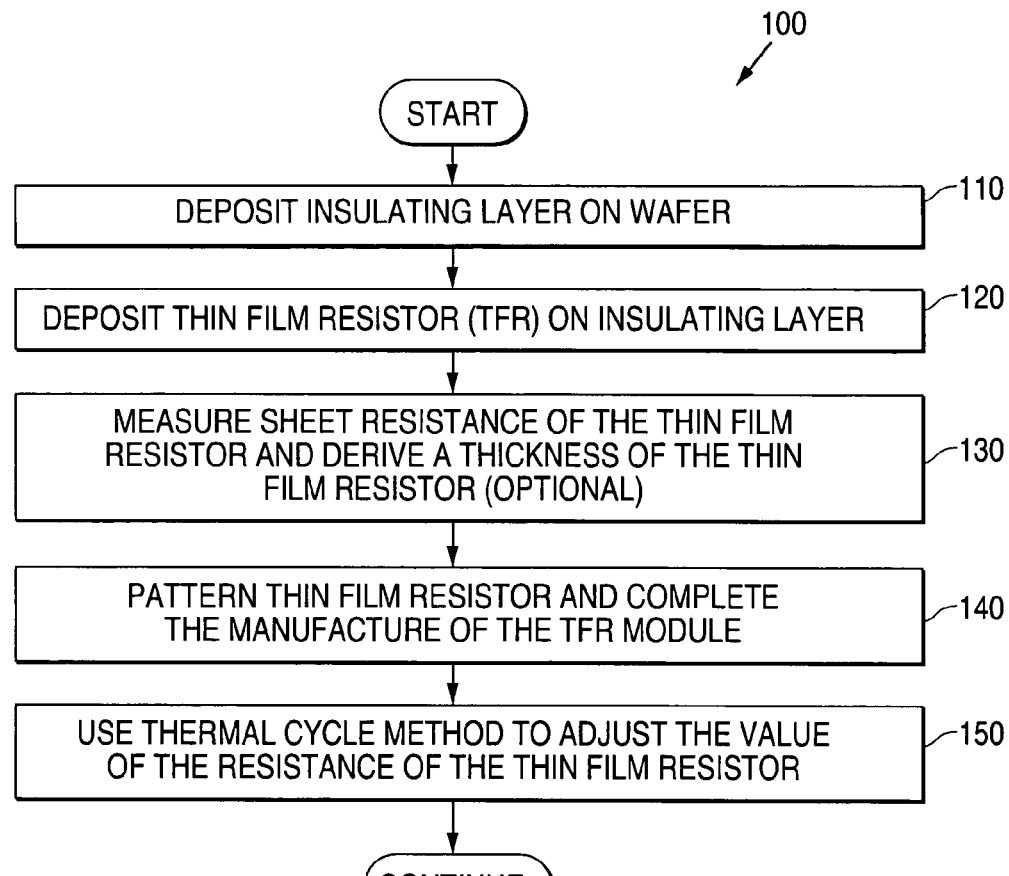
FIG. 1 illustrates a flow chart showing a semiconductor thin film resistor manufacturing process according to a prior art method.

FIG. 1 illustrates a flow chart 100 showing a prior art semiconductor thin film resistor manufacturing process. Initially, a suitable semiconductor wafer is supplied and an insulating layer is deposited on the semiconductor wafer (step 110). Then the thin film resistor (TFR) is deposited on the insulating layer (step 120). In an optional step, the sheet resistance of the thin film resistor is measured and a thickness of the thin film resistor is derived (step 130). Then the thin film resistor is patterned and the manufacture of the thin film resistor module is completed using conventional prior art methods (step 140). Then a thermal cycle method is applied to adjust a value of resistance of the thin film resistor (step 150).

As previously mentioned, the prior art thermal cycle method for adjusting a value of resistance of a thin film resistor is not always practical. One problem is that a thermal cycle is not self limiting. It is possible that the thermal cycle method may introduce more variation in the resistance of the thin film resistor than it eliminates.

Figure 2:
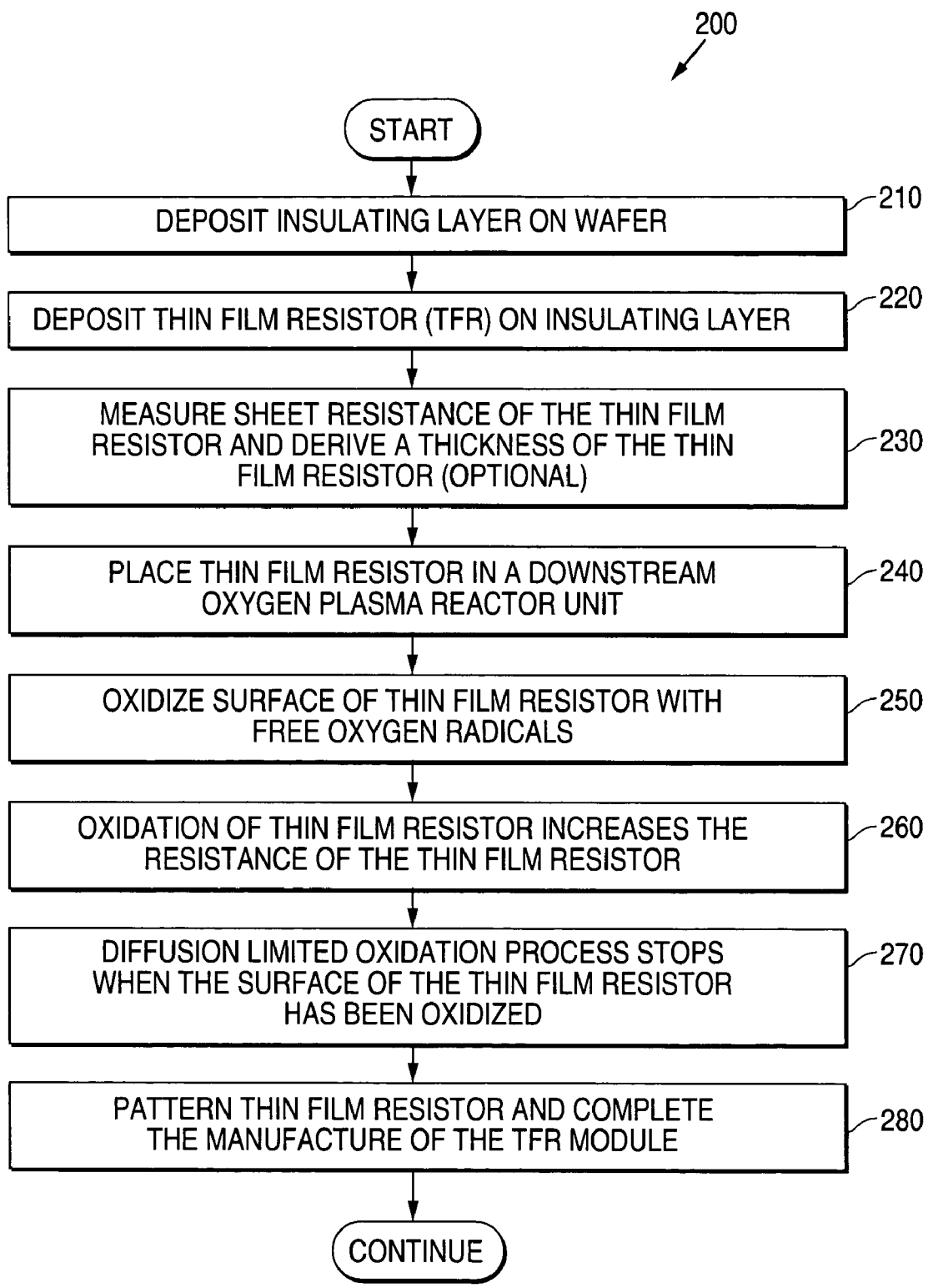
FIG. 2 illustrates a flow chart showing a semiconductor thin film resistor manufacturing process according to an exemplary embodiment of the invention.

FIG. 2 illustrates a flow chart 200 showing a semiconductor thin film resistor manufacturing process according to an exemplary embodiment of the invention. Initially, a suitable semiconductor wafer is supplied and an insulating layer is deposited on the semiconductor wafer (step 210). Then the thin film resistor (TFR) is deposited on the insulating layer (step 220). In an optional step, the sheet resistance of the thin film resistor is measured and a thickness of the thin film resistor is derived (step 230).

Then the thin film resistor is placed in an oxidizing atmosphere in a downstream oxygen plasma reactor unit (step 240). Free oxygen radicals are applied to the surface of the thin film resistor and the surface of the thin film resistor is oxidized (step 250). The oxidation of the thin film resistor increases the resistance of the thin film resistor (step 260). Because the oxidation process is diffusion limited, the oxidation process stops when the surface of the thin film resistor has been oxidized (step 270). Then the thin film resistor is patterned and the manufacture of the thin film resistor module is completed using conventional prior art methods (step 280).

Figure 3:
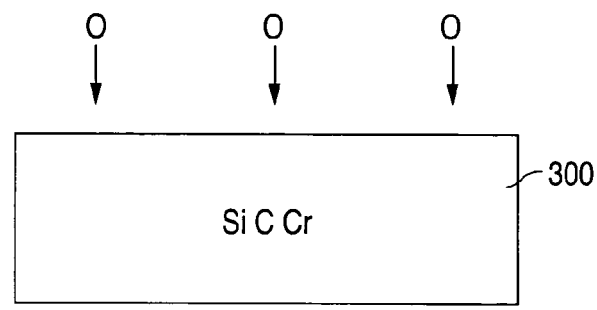
FIG. 3 illustrates an exemplary thin film resistor to which free oxygen radicals of an oxygen plasma are applied in accordance with the principles of the present invention.

FIG. 3 illustrates an exemplary thin film resistor 300 to which free oxygen radicals are applied in accordance with the principles of the present invention. The thin film resistor 300 illustrated in FIG. 3 comprises a thin layer of silicon carbide chrome (SiCCr). The application of the free oxygen radicals to the surface of the thin film resistor 300 is represented by the arrows that point from the chemical symbol for oxygen (O).

Figure 4:
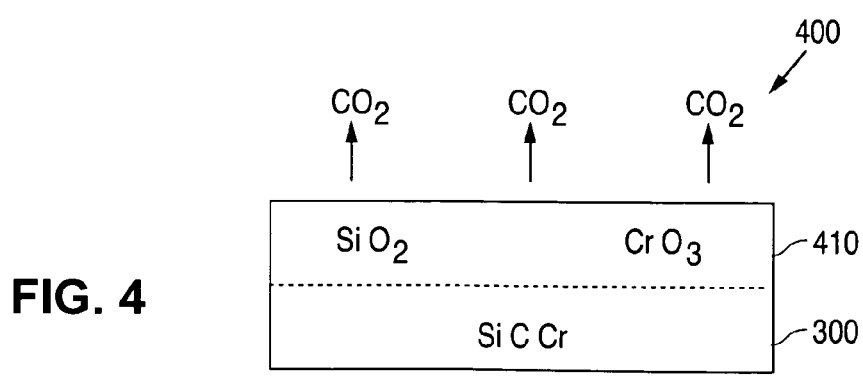
FIG. 4 illustrates an exemplary result of applying free oxygen radicals of an oxygen plasma to the thin film resistor shown in FIG. 3.

FIG. 4 illustrates an exemplary thin film resistor 400 that results from applying the free oxygen radicals to the thin film resistor 300 shown in FIG. 3. The oxidized top portion of the thin film resistor 400 is designated with reference numeral 410. Oxidized top portion 410 is made up of the oxidation products of the silicon carbide chrome (SiCCr). Specifically, the oxidized top portion 410 contains, for example, silicon dioxide ($SiO_2$) and chromium oxide ($CrO_3$). In addition, carbon dioxide ($CO_2$) gas evolves from the oxidized top portion 410 of thin film resistor 400. The evolution of the carbon dioxide ($CO_2$) gas from the surface of the oxidized top portion 410 of thin film resistor 400 is represented by the arrows that point towards the chemical symbol for carbon dioxide ($CO_2$).

Figure 5:
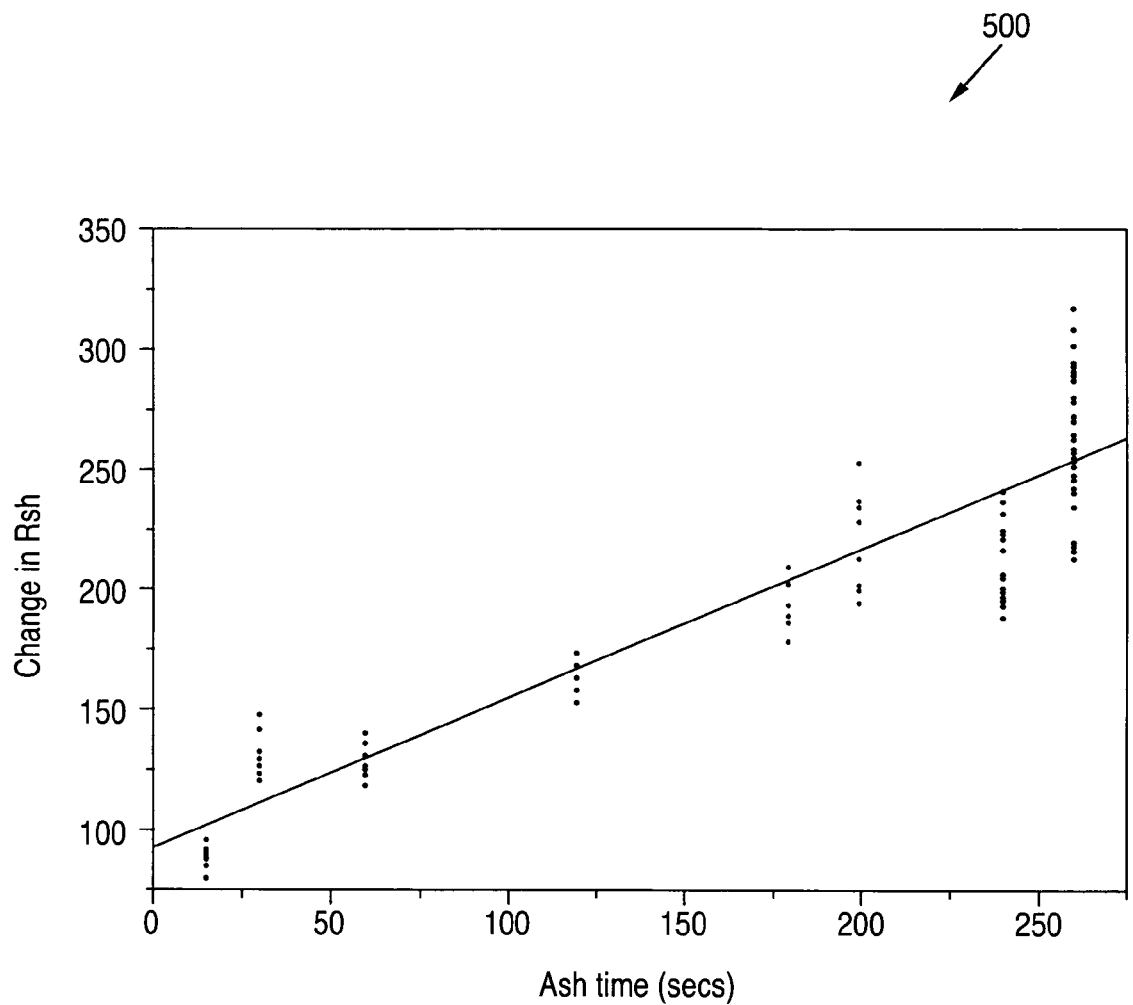
FIG. 5 illustrates an exemplary graph showing that the value of resistance of a thin film resistor increases linearly with time when the thin film resistor is exposed to the free oxygen radicals of an oxygen plasma.

FIG. 5 illustrates an exemplary graph 500 showing that the value of resistance of a thin film resistor increases linearly with the time that the thin film resistor is exposed to free oxygen radicals of an oxygen plasma ash. The horizontal axis of exemplary graph 500 records the exposure time in seconds of a thin film resistor to an oxygen plasma ash. The horizontal axis is labeled "Ash time (secs)". The vertical axis of exemplary graph 500 records the change (i.e., increased values) of sheet resistance of the thin film resistor as a function of time. The vertical axis is labeled "Change in Rsh". FIG. 5 illustrates that the diffusion process initially increases the resistance of the thin film resistor linearly over time.

As previously mentioned, because the oxidation process is diffusion limited, the oxidation process is self limited. At some point in time, the increasing thickness of oxidation compounds (e.g., $SiO_2$ and $CrO_3$) in top layer 410 of thin film resistor 400 eventually reduce the amount of thin film resistor material (e.g., SiCCr 300) that is exposed to the oxygen plasma. Then the increase in resistance of the thin film resistor 400 no longer increases linearly with time.

However, the resistance of the thin film resistor 400 may be further increased by increasing the diffusion rate of the oxygen. This may be accomplished by increasing the temperature at which the thin film resistor 400 is exposed to the oxygen plasma. For example, assume that when a thin film resistor 400 is exposed to an oxygen plasma at room temperature (approximately twenty three degrees Centigrade (23° C.) an oxidized top layer 410 is observed to form that has a thickness that is "X Ångstroms." Then when the thin film resistor 400 is exposed to an oxygen plasma at approximately fifty degrees Centigrade (50° C.) an oxidized top layer 410 is observed to form that has a thickness that is "(X+10) Ångstroms." The increase in temperature increases the diffusion rate of the oxygen. The increased diffusion rate of the oxygen increased the thickness of the oxidized top layer 410. By making empirical measurements, it is possible to obtain a relationship between the increases in thin film resistance as a function of the increases in temperature.

An advantageous application of the present invention is to provide more precise control in the manufacture of thin film resistors. For example, a thin film resistor may be deposited with a relatively thick layer. The deposition equipment available may be quite capable of precisely controlling the deposition of the thin film resistor for the relatively thick layer. After the thin film resistor has been deposited, the resistance of the thin film resistor will be too low. However, the resistance of the thin film resistor may be increased to its target value using the oxidation method of the present invention.

For a numerical example, assume that a thin film resistor having a thickness of one hundred Ångstroms (100 Å) has a sheet resistance of approximately one thousand ohms (1000 Ω) per square unit area. Also assume that the same thin film resistor having a thickness of fifty Ångstroms (50 Å) has a sheet resistance of approximately two thousand ohms (2000 Å) per square unit area.

It is considerably more difficult to control the manufacture of the thin film resistor when the thickness of the thin film resistor is fifty Ångstroms (50 Å). However, if one takes the thin film resistor having a thickness of one hundred Ångstroms (100 Å) and oxidizes a top layer of fifty Ångstroms (50 Å) the resulting thin film resistor will also have a resistance of two thousand ohms (2000 Ω) per square unit area.

Rather than having a very difficult to control fifty Ångstrom (50 Å) metal deposition, one has a relatively easier to control one hundred Ångstroms (100 Å) metal deposition followed by a self limiting oxidation step. The thicker (100 Å) thin film resistor that is subsequently oxidized has the same resistance (2000 Ω/unit area) as the thinner (50 Å) thin film resistor. The present invention greatly facilitates the efficient manufacture of thin film resistors.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for adjusting a value of resistance of a thin film resistor with a diffusion limited oxidation, said method comprising the steps of:
   placing said thin film resistor in an oxidizing atmosphere; and
   oxidizing a surface of said thin film resistor at a diffusion rate to form an oxidized layer thereon to increase said value of resistance;
   wherein, as said surface of said thin film resistor is oxidized, a thickness of said oxidized layer is increased to slow said diffusion rate through a remaining unoxidized portion of said thin film resistor so that said diffusion limited oxidation is self-limiting.

2. The method as claimed in claim 1, wherein said step of placing said thin film resistor in an oxidizing atmosphere comprises the step of:
   placing said thin film resistor in a plasma reactor unit.

3. The method as claimed in claim 1, wherein said step of oxidizing a surface of said thin film to increase said value of resistance comprises the step of:
   oxidizing said surface of said thin film resistor with free oxygen radicals.

4. The method as claimed in claim 1, further comprising the step of:
   increasing the diffusion rate of said diffusion limited oxidation.

5. The method as claimed in claim 4, wherein said step of increasing the diffusion rate of said diffusion limited oxidation comprises:
   increasing a temperature of free oxygen radicals of said diffusion limited oxidation.

6. The method as claimed in claim 1, further comprising the step of:
   selecting a value of increase for said value of resistance of said thin film resistor by selecting a value of temperature for said oxidizing atmosphere.

7. A method for adjusting a value of resistance of a thin film resistor with a diffusion limited oxidation to cause said thin film resistor to have a desired value of resistance, said method comprising the steps of:
   forming said thin film resistor having an initial value of resistance that is less than said desired value of resistance;
   placing said thin film resistor in an oxidizing atmosphere; and
   oxidizing a surface of said thin film resistor at a diffusion rate to form an oxidized layer thereon to increase said initial value of resistance to said desired value of resistance;
   wherein, as said surface of said thin film resistor is oxidized, a thickness of said oxidized layer is increased to slow said diffusion rate through a remaining unoxidized portion of said thin film resistor so that said diffusion limited oxidation is self-limiting.

8. The method as claimed in claim 7, wherein said step of placing said thin film resistor in an oxidizing atmosphere comprises the step of:
   placing said thin film resistor in a plasma reactor unit.

9. The method as claimed in claim 7, wherein said step of oxidizing a surface of said thin film resistor to increase said initial value of resistance to said desired value of resistance comprises the step of:
   oxidizing said surface of said thin film resistor with free oxygen radicals.

10. The method as claimed in claim 7, further comprising the step of:
    increasing the diffusion rate of said diffusion limited oxidation.

11. The method as claimed in claim 10, wherein said step of increasing the diffusion rate of said diffusion limited oxidation comprises:
    increasing a temperature of free oxygen radicals of said diffusion limited oxidation.

12. The method as claimed in claim 7, further comprising the step of:
    selecting a value of increase for said value of resistance of said thin film resistor by selecting a value of temperature for said oxidizing atmosphere.

13. A thin film resistor having an adjusted value of resistance, said thin film resistor manufactured by a diffusion limited oxidation comprising the steps of:
    placing a thin film resistor in an oxidizing atmosphere; and
    oxidizing a surface of said thin film resistor at a diffusion rate to form an oxidized layer thereon to increase a value of resistance of said thin film resistor;
    wherein, as said surface of said thin film resistor is oxidized, a thickness of said oxidized layer is increased to slow said diffusion rate through a remaining unoxidized portion of said thin film resistor so that said diffusion limited oxidation is self-limiting.

14. The thin film resistor as claimed in claim 13, wherein said step of placing a thin film resistor in an oxidizing atmosphere comprises the step of:
    placing said thin film resistor in a plasma reactor unit.

15. The thin film resistor is claimed in claim 13, wherein said step of oxidizing a surface of said thin film resistor to increase said value of resistance comprises the step of:
    oxidizing said surface of said thin film resistor with free oxygen radicals.

16. The thin film resistor as claimed in claim 13, further comprising the step of:
    increasing the diffusion rate of said diffusion limited oxidation.

17. The thin film resistor as claimed in claim 16, wherein said step of increasing the diffusion rate of said diffusion limited oxidation comprises:
    increasing a temperature of free oxygen radicals of said diffusion limited oxidation.

18. The thin film resistor as claimed in claim 13 wherein a value of increase for said value of resistance of said thin film resistor is selected by selecting a value of temperature for said oxidizing atmosphere.

19. The method of claim 1, wherein the diffusion limited oxidation is self-limiting in that oxidation of the thin film resistor stops after the surface of the thin film resistor has been oxidized by a specified amount, even if the thin film resistor remains in the oxidizing atmosphere.

20. The method of claim 1, wherein the diffusion limited oxidation is self-limiting in that one or more oxidation compounds that are formed substantially reduce an amount of thin film resistor material exposed to plasma in a plasma reactor unit during the diffusion limited oxidation.

21. The method of claim 20, wherein the one or more oxidation compounds achieve a thickness after which the resistance of the thin film resistor does not increase linearly with time during the diffusion limited oxidation.

\* \* \* \* \*

UNITED STATES PATENT AND TRADEMARK OFFICE
CERTIFICATE OF CORRECTION

PATENT NO. : 7,230,517 B1 Page 1 of 1
APPLICATION NO. : 10/927357
DATED : June 12, 2007
INVENTOR(S) : Richard W. Foote, Jr. et al.

It is certified that error appears in the above-identified patent and that said Letters Patent is hereby corrected as shown below:

Column 2, line 10, insert -- available -- after the term "equipment".

Signed and Sealed this

Eighteenth Day of September, 2007

JON W. DUDAS
*Director of the United States Patent and Trademark Office*